United States Patent
Ma

(10) Patent No.: US 8,044,745 B2
(45) Date of Patent: Oct. 25, 2011

(54) METHOD AND APPARATUS FOR APPLYING CLOCK PHASE AND FREQUENCY OFFSET

(75) Inventor: Stanley Jeh-Chun Ma, Ottawa (CA)

(73) Assignee: Agere Systems Inc., Allentown, PA (US)

( * ) Notice: Subject to any disclaimer, the term of this patent is extended or adjusted under 35 U.S.C. 154(b) by 141 days.

(21) Appl. No.: 12/361,129

(22) Filed: Jan. 28, 2009

(65) Prior Publication Data

US 2010/0188129 A1 Jul. 29, 2010

(51) Int. Cl.
*H03C 3/38* (2006.01)
*H04B 1/69* (2011.01)

(52) U.S. Cl. ......... 332/117; 332/103; 332/120; 375/130

(58) Field of Classification Search ............. 332/117, 332/120, 123, 149, 159, 103, 104, 105; 375/130, 375/139, 140, 302, 354, 362
See application file for complete search history.

(56) References Cited

U.S. PATENT DOCUMENTS

| | | | | |
|---|---|---|---|---|
| 3,231,672 | A * | 1/1966 | Collins, Jr. et al. | 381/16 |
| 5,111,163 | A * | 5/1992 | Erlich | 332/117 |
| 6,072,374 | A * | 6/2000 | Takahashi | 332/117 |
| 6,130,919 | A * | 10/2000 | Lin | 375/302 |
| 6,653,896 | B2 * | 11/2003 | Sevic et al. | 330/10 |
| 6,983,024 | B2 * | 1/2006 | Ballantyne | 375/261 |
| 2004/0066857 | A1 * | 4/2004 | Srinivasan et al. | 375/298 |

OTHER PUBLICATIONS

Hsieh et al., "Clock and Data Recovery with Adaptive Loop Gain for Spread Spectrum SerDes Applications", May 2005, Circuits and Systems, 2005. ISCAS 2005. IEEE International Symposium on, vol. 5, pp. 4883-4886.*

Chen, Wei-Ta et al, "A Spread Spectrum Clock Generator for SATA-II", Int'l Symposium on Circuits and Systems, 2005, pp. 2643-2646.

Chen, Chao-Chyun et al, "A Fully Integrated Spread Spectrum Clock Generator", Int'l Symposium on VLSI Design, Automation and Test, 2006, pp. 1-4.

Hsieh, Yi-Bin and Kao, Yao-Huang, "A New Spread Spectrum Clock Generator for SATA Using Double Modulation Schemes", Custom Integrated Circuits Conference, 2007, pp. 297-300.

Lee, Hyung-Rok et al, "A low-jitter 5000ppm spread spectrum clock generator for multi-channel SATA transceiver in 0.18 um CMOS", ISSCC, 2005, pp. 162-590.

* cited by examiner

*Primary Examiner* — Ryan Johnson
(74) *Attorney, Agent, or Firm* — Hamilton DeSanctis & Cha

(57) ABSTRACT

Various apparatuses and methods for offsetting the phase and/or frequency of a clock signal are disclosed herein. For example, some embodiments provide an apparatus for generating a clock signal, including a quadrature delay circuit connected to an input clock signal. The quadrature delay circuit outputs components of the input clock signal with different phase shifts. A first amplitude modulator is connected to the first output of the quadrature delay circuit, and a second amplitude modulator is connected to the second output of the quadrature delay circuit. A summer combines the output of the first and second amplitude modulators.

25 Claims, 3 Drawing Sheets

METHOD AND APPARATUS FOR APPLYING CLOCK PHASE AND FREQUENCY OFFSET

BACKGROUND

Electronic devices often radiate electromagnetic energy that can interfere with nearby devices. As components in an electronic device are switched on and off, the rapid changes in electrical current flow generate an electromagnetic field. This results in electromagnetic interference (EMI) to nearby devices. As electronic devices have become widespread and common, regulation of EMI has become increasingly important and has resulted in standards and regulatory limits on EMI emission. EMI management in synchronous data transmission circuits that operate on a constant frequency is particularly difficult, because the electromagnetic energy is radiated within a narrow bandwidth. Because the radiation is focused within a narrow bandwidth, it is stronger within the bandwidth and may exceed regulatory limits. For example, data storage devices such as serial advanced technology attachments (SATA) drives that transfer a stream of data with a constant clock frequency tend to focus EMI within a very narrow bandwidth.

Various techniques have been developed to manage EMI such as shielding, spread spectrum and frequency hopping. Shielding blocks EMI with grounded metal structures but is bulky and costly. Spread spectrum and frequency hopping prevent the EMI from focusing within a narrow constant bandwidth by spreading it across a wider bandwidth or continuously moving it to different frequencies. Spread spectrum is a technique that continuously modulates the frequency of a clock signal to reduce the EMI seen at any particular frequency. For example, in SATA drives the clock signal may be modulated by downspreading, lowering the clock frequency and consequently the data transmission frequency in a sawtooth fashion. Current solutions perform spread spectrum by altering the frequency of the clock source, such as by modulating the feedback divider from the voltage controlled oscillator (VCO) in a phase locked loop (PLL). However, for applications requiring independent spectrum control on multiple channels, this requires a PLL for each channel.

SUMMARY

Various apparatuses and methods for offsetting the phase or frequency of a clock signal are disclosed herein. For example, some embodiments provide an apparatus for generating a clock signal, including a quadrature delay circuit connected to an input clock signal. The quadrature delay circuit outputs components of the input clock signal with different phase shifts. A first amplitude modulator is connected to the first output of the quadrature delay circuit, and a second amplitude modulator is connected to the second output of the quadrature delay circuit. A summer combines the output of the first and second amplitude modulators.

Other particular embodiments provide a method of generating a clock, including generating a frequency modulation profile from a frequency offset input, and offsetting an input clock signal according to the frequency modulation profile.

In some particular embodiments of the method, the frequency of the input clock signal is offset by dividing the input clock signal into an in-phase phasor and a quadrature phasor, modulating the amplitude of the in-phase and quadrature phasors based on the frequency modulation profile, and combining the modulated phasors to form an output clock signal.

Other embodiments provide a storage device including a clock source and a plurality of clock signals connected to the clock source. The input of a quadrature delay circuit is connected to one of the plurality of clock signals. The quadrature delay circuit is adapted to provide an in-phase phasor of the input clock signal on a first output and a quadrature phasor of the input clock signal on a second output. A first amplitude modulator is connected to the first output of the quadrature delay circuit, and a second amplitude modulator is connected to the second output of the quadrature delay circuit. The output of the first and second amplitude modulators is combined in a summer. The gain of the first and second amplitude modulators is varied based on a frequency offset input. An integrator is connected to the frequency offset input, the integrator including an accumulator with a feedback loop and delay element. Another quadrature delay circuit is connected to the integrator, with first and second outputs of the quadrature delay circuit being connected to digital to analog converters. The outputs of the digital to analog converters are filtered in first and second low pass filters, and the outputs of the first and second low pass filters are connected to gain inputs of the first and second amplitude modulators.

BRIEF DESCRIPTION OF THE DRAWINGS

A further understanding of the various embodiments may be realized by reference to the figures which are described in remaining portions of the specification. In the figures, like reference numerals may be used throughout several drawings to refer to similar components.

DESCRIPTION

Figure 7:
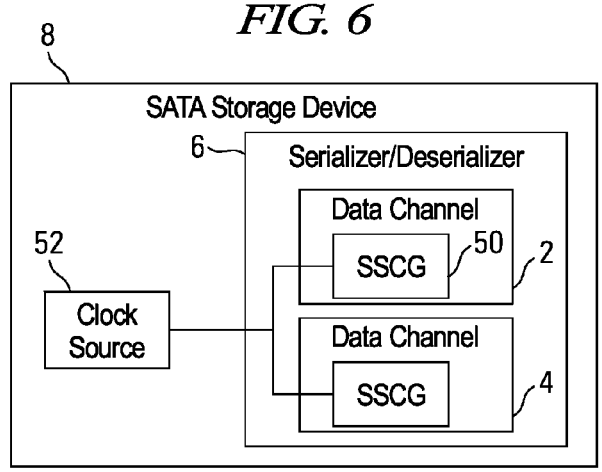
FIG. 7 is a block diagram of flow chart of a method for offsetting the phase or frequency of a clock signal.

The drawings and description, in general, disclose various embodiments of a method and apparatus for offsetting the phase or frequency of a clock signal that may be applied to any clock signal without the need to directly modify the clock source. An arbitrary frequency modulation profile may be used to control the spread spectrum. In one particular embodiment, a frequency modulation profile is constructed in the digital domain based on a frequency offset input, and the frequency modulation profile is used to offset the input clock. The frequency modulation profile may be based on any desired spreading waveform at the frequency offset input, such as a triangular wave, a constant offset, etc., to achieve the desired spectrum spreading. The method and apparatus may be applied to any clock in any application desired to offset the phase or frequency of a clock signal. In one example, the method and apparatus may be used as a spread spectrum generator (e.g., 50, FIG. 7) that is applied to each channel 2 and 4 of a serializer/deserializer (serdes) 6 in the physical layer serial interface of a SATA storage device 8. A single master clock PLL may therefore be used to generate a master clock signal that is provided to each of a number of data channels 2 and 4. A spread spectrum generator (e.g., 50) is connected to the clock signal in each data channel 2 and 4 to provide independent continuous modulation of the data rate by small amounts in each channel 2 and 4. This allows each channel 2 and 4 to have independent control of the spread spectrum functionality without the need for multiple PLLs. In this example, the spread spectrum generators (e.g., 50) may be used in the transmitter or receiver or both. The method and apparatus can also accurately provide a predictable phase shift in a clock if the digital frequency offset is applied for a short time and then removed. Because phase is the integral of frequency, that short pulse of frequency offset translates to a very predictable phase offset. Having the ability to accurately phase offset a clock has many applications, some of which may be directly employed in the clock and data recovery (CDR) circuits of a serdes receiver. Again, however, the spread spectrum generator is not limited to use in any specific application.

Before describing the method and apparatus in more detail, several terms used herein will be defined. Various embodiments include a quadrature delay circuit for dividing either an input clock signal or an internal phase modulation signal into multiple outputs of different phases. A quadrature delay circuit may comprise any circuit, executable program code or other device for splitting an input signal into multiple outputs of different phases. For example, it may produce an in-phase phasor and a quadrature phasor from an input, sinusoidal components of the input whose phase differs by 90 degrees. The term "phasor" refers herein to a generally sinusoidal component of another alternating signal. In some embodiments, a phasor has a constant amplitude, phase and frequency when based on an input waveform with constant amplitude, phase and frequency. Any device now known or that may be developed in the future may be employed as a quadrature delay circuit, such as a polyphase filter, a gyrator, a delay locked loop, etc. The phase difference of the outputs is not limited to the 90 degree difference of various examples set forth herein, but may have any desired phase difference. Thus, although the terms "in-phase phasor" and "quadrature phasor" apply in one example to sinusoidal components with a 90 degree phase difference, they are not limited to components with a 90 degree phase difference.

Various embodiments include amplitude modulators and summers. The term "amplitude modulator" is used to refer to any device for changing the amplitude of an input signal, such as a variable gain amplifier. The term "summer" refers to any device for combining multiple signals in any way, such as an adder, accumulator, active or passive mixer, etc. Although examples of summers are set forth herein with two inputs, a summer as used herein is not limited to any particular number of inputs. The phrase "generating a clock signal" refers herein to the process of creating an alternating clock signal, either based on an input clock signal or independently created.

Figure 1:
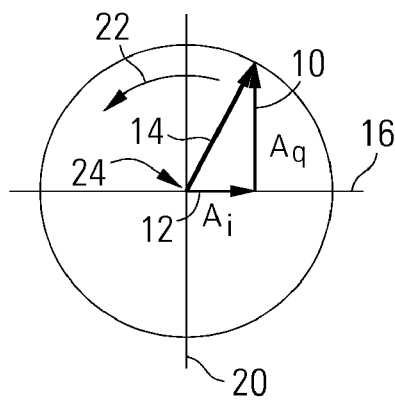
FIG. 1 depicts a phase rotation plot illustrating in-phase and quadrature phasors.

Turning now to FIG. 1, the in-phase and quadrature phasors used to achieve a frequency offset in the phase and frequency offset apparatus will be described. Although the spread spectrum generator will be described in terms of sinusoidal signals, it is important to note that the spread spectrum generator may be used with any type of alternating waveform, such as a square wave. The plot of FIG. 1 illustrates the in-phase phasor 10 and quadrature phasor 12 for a signal 14, illustrating how the signal can be divided into two components 10 and 12 of 90 degree phase difference. The quadrature phase is plotted on the x-axis 16 and the in-phase phase is plotted on the y-axis 20. As the phase of the signal 14 changes, rotating 22 it about the origin 24, the amplitude of the in-phase and quadrature phasors 10 and 12 varies. (Again, although phasors of 90 degree phase difference are being described, the spread spectrum generator is not limited to phasors of exactly 90 degree phase difference.) The equation for the voltage of an alternating signal may be expressed by:

$$V_{OUT} = A_i * \cos(\omega t) + A_q * \sin(\omega t) \quad (1)$$

where $A_i$ is the amplitude of the in-phase phasor and $A_q$ is the amplitude of the quadrature phasor in one embodiment. (Although the in-phase phasor in this example is given by the sine function and the quadrature phasor is given by the cosine function, the spread spectrum generator is not limited to this definition and the phasors may be swapped or otherwise varied.)

Figure 2A:
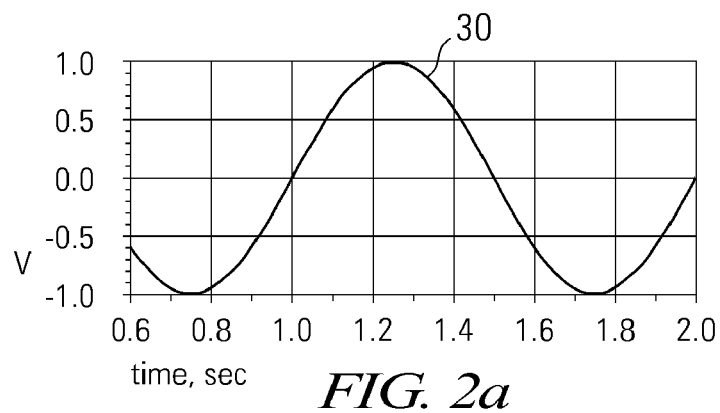
FIGS. 2a-2c depict a sinusoidal signal with various degrees of phase offset based on different in-phase and quadrature phasor amplitudes.
Figure 2B:
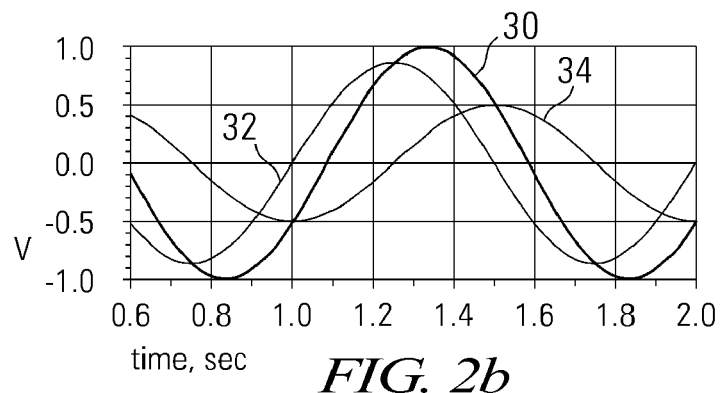
Figure 2C:
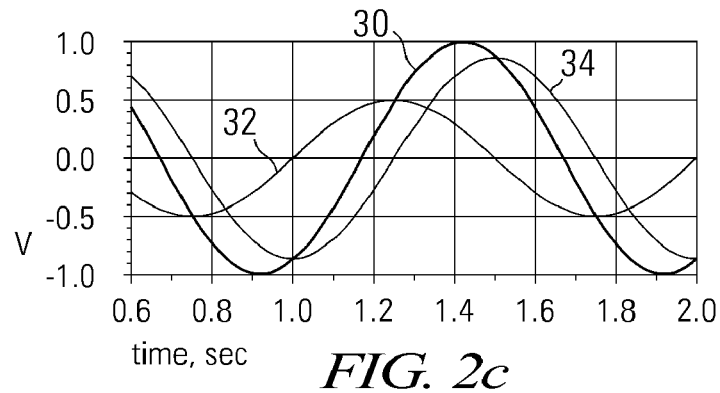

By modulating $A_i$ and $A_q$, a phase rotation 22 that is superimposed upon the existing nominal frequency can be achieved, resulting in a decrease or increase in output frequency. This is illustrated in FIGS. 2a-c and expressed by the following equations:

$$V_{OUT} = A_i(t) * \cos(\omega t) + A_q(t) * \sin(\omega t) \quad (2)$$

$$A_i^2(t) + A_q^2(t) = 1 \quad (3)$$

The phasor amplitudes $A_i$ and $A_q$ are modulated as a function of time as expressed in equation (2), while maintaining the same overall amplitude as expressed in equation (3). FIGS. 2a-2c illustrate the phase offset achieved by varying the phasor amplitudes for three pairs of in-phase and quadrature phasor amplitudes. A sinusoidal signal 30 with an in-phase amplitude $A_i$ of 1 and a quadrature phase amplitude $A_q$ of 0 is illustrated in FIG. 2a. The sinusoidal signal 30 thus has a nominal phase shift of zero. In FIG. 2b, the in-phase phasor 32 of signal 30 has a amplitude $A_i$ of 0.866 and the quadrature phasor 34 has a amplitude $A_q$ of 0.5. The signal 30 is thus phase shifted to the right, although the overall amplitude has not changed ($0.866^2 + 0.5^2 = 1$). In FIG. 2c, the in-phase phasor 32 of signal 30 has a amplitude $A_i$ of 0.5 and the quadrature phasor 34 has a amplitude $A_q$ of 0.866, shifting the signal 30 even further to the right. Note that the in-phase phasor 32 and quadrature phasor 34 maintain the same phase in FIGS. 2b and 2c, indicating that the input frequency and phase remains constant, while the phase of the sinusoidal signal 30 shifts as the phasor amplitudes $A_i$ and $A_q$ are modulated. Thus, an output signal with varying phase may be generated by modulating the amplitudes of the in-phase and quadrature phasors of an input signal and recombining them to form the output signal. In addition to changing the phase of an output signal 30 by changing the phasor amplitudes, it may be seen that the frequency of the output signal 30 may also be varied by continuously modulating the phasor amplitudes, in effect moving from the phase offset of FIG. 2a to that of FIG. 2b and then FIG. 2c, etc.

Figure 3:
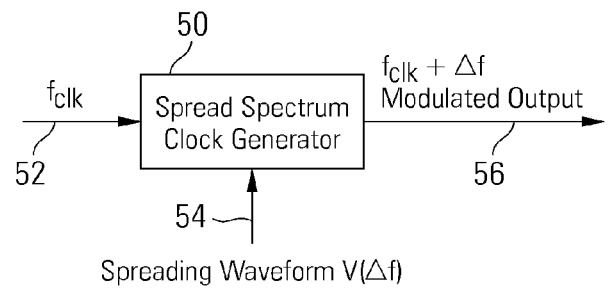
FIG. 3 depicts a block box view of a phase or frequency offset apparatus in use as a spread spectrum generator.

A black box view of the phase and frequency offset apparatus used as a spread spectrum generator 50 is illustrated in FIG. 3. An input clock $f_{clk}$ 52 is connected to the spread spectrum generator 50. A spreading waveform $V(\Delta f)$ 54 is connected to the spread spectrum generator 50 to specify the frequency offset to be applied to the input clock 52 by the spread spectrum generator 50. The frequency modulated output clock $f_{clk} + \Delta f$ 56 is produced by the spread spectrum generator 50. Thus, the spread spectrum generator 50 may be connected to any clock source 52 along with any spreading waveform 54 (e.g., triangular, constant, etc.) to generate an output clock 56 with a modulated frequency. The spread spectrum generator 50 may be used to reduce EMI by spreading the spectrum of the clock, or may be used to predictably and controllably apply a phase offset to a signal by applying a brief phase shift in a pulse on the spreading waveform 54, then continuing to operate without further offset applied by the spreading waveform 54.

Figure 4:
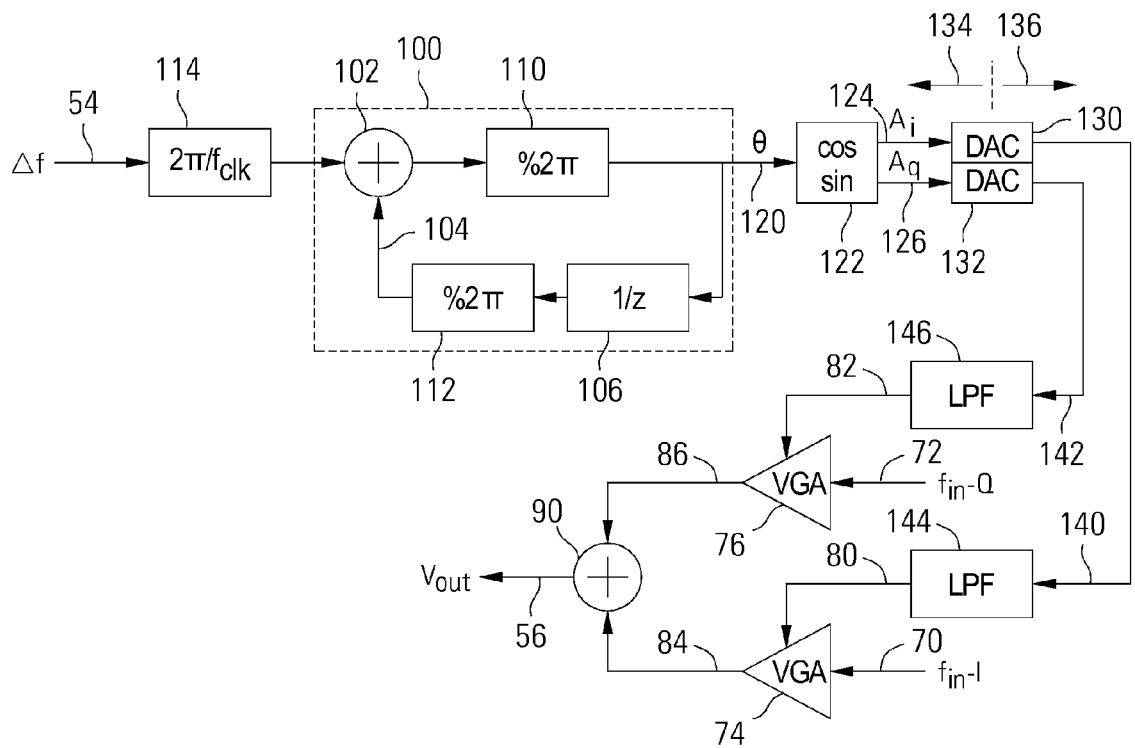
FIG. 4 depicts a block diagram of a phase or frequency offset apparatus as it may be used in a spread spectrum generator or phase offset device.

Turning now to FIG. 4, the spread spectrum generator 50 will be described in more detail. The amplitude of the in-phase phasor 70 and the quadrature phasor 72 of an input clock 52 (not shown in FIG. 4) are each modulated or otherwise varied in variable gain amplifiers 74 and 76, respectively, under the control of modulation control signals 80 and 82. The in-phase phasor 70 and quadrature phasor 72 of an input clock 52 may be obtained in any suitable manner. For example, they may be directly available from a PLL, or they may be obtained from a single clock signal using a quadrature delay circuit (not shown), such as a polyphase filter, a gyrator, or a delay locked loop, etc. The modulated in-phase and quadrature phasors 84 and 86 are combined in a summer 90 to form a frequency modulated output clock fclk+Δf 56. As discussed above, the functionality of the variable gain amplifiers 74 and 76 and the summer 90 may be provided in any suitable manner. For example, they may be implemented using a Gilbert cell mixer, or with discrete amplifiers and summer, etc.

The frequency modulation profile in the modulation control signals 80 and 82 in one particular embodiment is constructed in the digital domain based on a spreading waveform on the frequency offset input 54. An integrator 100 is used to obtain the phase offset from the frequency of the spreading waveform 54. The spreading waveform 54 specifies the desired frequency offset, and the integrator 100 calculates the phase offset to be applied as a function of time to the input clock 52 to achieve the desired frequency offset. The integrator 100 may be implemented in any suitable manner. For example, an accumulator 102 may be used to combine the spreading waveform 54 with a feedback signal 104 that has been delayed by a delay element 106. Scaling factors 110 and 112 shown in FIG. 4 in the accumulator 102 indicate that the accumulator 102 wraps around when it reaches a maximum value, rather than accumulating infinitely. The spreading waveform 54 may also be scaled by a scaling factor 114 before integration as desired to maintain suitable output levels at the phase signal output 120 of the integrator 100. The phase signal 120 is divided into two phasor components in a quadrature delay circuit 122. As discussed above, the quadrature delay circuit 122 may be implemented in any manner desired to generate an in-phase phasor 124 and a quadrature phasor 126 from the phase signal 120. In one particular embodiment, the quadrature delay circuit 122 is implemented in the digital domain using a lookup table that looks up the sine and cosine of the input phase to obtain the $A_i$ and $A_q$ amplitude coefficients. In other embodiments, the quadrature delay circuit 122 is implemented in the analog domain using a polyphase filter or a gyrator, a delay locked loop, etc.

The in-phase and quadrature phasors $A_i$ 124 and $A_q$ 126 from the phase signal 120 are converted from the digital domain to the analog domain in digital to analog converters (DACs) 130 and 132. In the embodiment illustrated in FIG. 4, the elements on the incoming side 134 of the DACs 130 and 132 are in the digital domain, and the elements on the outgoing side 136 of the DACs 130 and 132 are in the analog domain. Various other embodiments may be implemented entirely in the digital domain, entirely in the analog domain, or in any desired combination thereof. The analog in-phase phasor $A_i$ 140 and the analog quadrature phasor $A_q$ 142 may be filtered in low pass filters 144 and 146 to smooth the waveforms produced by the DACs 130 and 132. The resulting smoothed analog in-phase and quadrature phasors $A_i$ and $A_q$ are then used as the modulation control signals 80 and 82, respectively, to control the gain applied by the variable gain amplifiers 74 and 76 to the in-phase and quadrature phasors 70 and 72 of the input clock. The amplitude modulated phasors 84 and 86 are then combined to form the output clock 56 that has had a phase offset applied based on the spreading waveform 54, or a frequency offset applied if the spreading waveform 54 applies a continuous change.

In this example with everything to the incoming side 134 of the DACs 130 and 132 in the digital domain, the spreading waveform 54 is a multi-bit digital input signal that carries an indication of the desired frequency shift. Any value other than zero changes the in-phase and quadrature phasors 124 and 126 on a continuous basis. The apparatus for offsetting the phase or frequency of a clock signal 50 can be used to apply a frequency offset by continuously applying a non-zero spreading waveform 54, or to apply a phase offset by applying a non-zero pulse on the spreading waveform 54 just long enough to achieve the desired phase offset.

As discussed above, the variable gain amplifiers 74 and 76 and the summer 90 may be implemented using a Gilbert cell mixer. In one embodiment, the variable gain amplifiers 74 and 76 and the summer 90 are a single side-band Gilbert cell mixer that is operated in the linear region, with inputs connected to complementary in-phase and quadrature phasors of the input clock and complementary amplitude coefficients for the in-phase and quadrature phasors of the phase signal.

Figure 5:
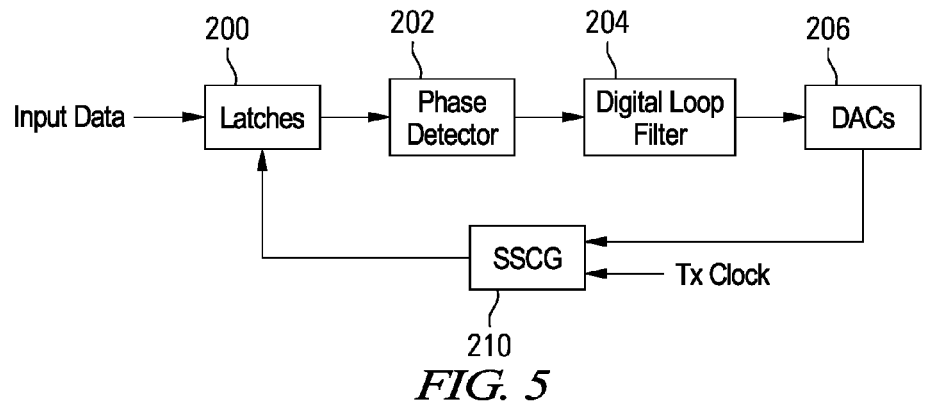
FIG. 5 depicts a clock and data recovery circuit with an apparatus for offsetting the phase or frequency of a clock signal.

Turning now to FIG. 5, the application of a spread spectrum generator as disclosed herein in a clock and data recovery circuit will be described. Input data is received by the clock and data recovery circuit and passes through a feedback loop including latches 200, a phase detector 202, digital loop filter 204 and DACs 206. Where a VCO would normally be placed in the feedback path, a spread spectrum generator 210 may be used. The transmit clock is provided to the spread spectrum generator as the input clock, and the feedback from the phase detector, digital loop filter and DACs is used as the phase/frequency offset input to the spread spectrum generator. The spread spectrum generator adjusts the phase and frequency of the clock signal used by the latches to capture the input data, enabling the clock and data recovery circuit to lock onto the input data stream without requiring a VCO.

Figure 6:
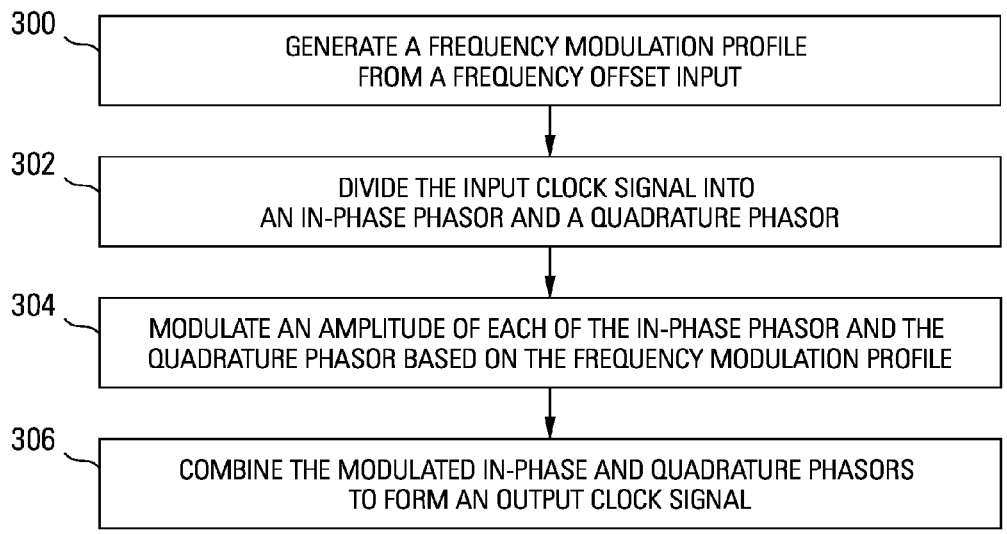
FIG. 6 is a flow chart of a method for offsetting the phase or frequency of a clock signal.

Turning now to FIG. 6, an example of a method of generating a clock signal will be summarized. A frequency modulation profile is generated from a frequency offset input (Block 300), and a phase or frequency offset is applied to the input clock signal based on the frequency modulation profile. The offset is applied by dividing the input clock signal into an in-phase phasor and a quadrature phasor (Block 302), modulating an amplitude of each of the in-phase phasor and the quadrature phasor based on the frequency modulation profile (Block 304), and combining the modulated in-phase and quadrature phasors to form an output clock signal. (Block 306)

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. An apparatus for generating a clock signal, the apparatus comprising:
   a quadrature delay circuit having an input, a first output and a second output, the input being connected to an input clock signal, wherein the quadrature delay circuit is adapted to provide a first component of the input clock signal on the first output and a second component of the input clock signal on the second output, wherein the first component and the second component each have a different phase shift;
a first amplitude modulator having an input and an output, the input being connected to the first output of the quadrature delay circuit;
a second amplitude modulator having an input and an output, the input being connected to the second output of the quadrature delay circuit; and
a summer having a first input, a second input and a clock output, the first input being connected to the output of the first amplitude modulator, the second input being connected to the output of the second amplitude modulator; and
a storage device having a clock source connected to a plurality of serializer/deserializers, wherein the quadrature delay circuit, first and second amplitude modulators and summer are connected between the clock source and at least one of the plurality of serializer/deserializers to provide a plurality of different frequency offsets in the plurality of serializer/deserializers.

2. The apparatus of claim 1, wherein the first and second amplitude modulators comprise variable gain amplifiers.

3. The apparatus of claim 1, further comprising a frequency modulator having a frequency offset input, a first output connected to a gain input of the first amplitude modulator and a second output connected to a gain input of the second amplitude modulator.

4. The apparatus of claim 3, wherein the frequency modulator comprises an integrator having an input and an output, the input being connected to the frequency offset input.

5. The apparatus of claim 4, wherein the integrator comprises:
an accumulator having a first input, a second input and an output, the first input being connected to the frequency offset input and the output comprising the integrator output; and
a delay element having an input connected to the accumulator output and an output connected to the second input of the accumulator.

6. The apparatus of claim 4, the frequency modulator further comprising a second quadrature delay circuit having an input, a first output and a second output, the input being connected to the integrator output.

7. The apparatus of claim 6, wherein the second quadrature delay circuit comprises a lookup table.

8. The apparatus of claim 6, the frequency modulator further comprising:
a first digital to analog converter having an input and an output, the input being connected to the first output of the second quadrature delay circuit; and
a second digital to analog converter having an input and an output, the input being connected to the second output of the second quadrature delay circuit.

9. The apparatus of claim 8, the frequency modulator further comprising:
a first low pass filter having an input and an output, the input being connected to the output of the first digital to analog converter, the output being connected to the first output of the frequency modulator; and
a second low pass filter having an input and an output, the input being connected to the output of the second digital to analog converter, the output being connected to the second output of the frequency modulator.

10. The apparatus of claim 1, wherein the first and second amplitude modulators and the summer comprise a Gilbert cell mixer.

11. The apparatus of claim 1, wherein the apparatus is implemented as part of storage drive.

12. A method of generating a clock, the method comprising:
generating at least two phase offset components from a frequency offset input, said generating comprising:
integrating the frequency offset input to generate a phase offset signal; and
dividing the phase offset signal into a pair of phasors, wherein the pair of phasors have a same frequency and a different phase; and
offsetting an input clock signal according to the frequency offset input, said offsetting comprising:
dividing the input clock signal into an in-phase phasor and a quadrature phasor;
controlling an amplitude of each of the in-phase phasor and the quadrature phasor based on the pair of phasors
combining the amplitude-controlled in-phase and quadrature phasors to form an output clock signal; and
providing a pulse at the frequency offset input, wherein the pulse causes a phase offset between the output clock signal and the input clock signal, while leaving the output clock signal at a frequency of the input clock signal.

13. The method of claim 12, said generating further comprising:
converting the pair of phasors from analog values to digital values; and
low pass filtering the pair of digital phasors, wherein the amplitude of each of the in-phase phasor and the quadrature phasor is set by a corresponding one of the pair of digital filtered phasors.

14. The method of claim 12, wherein the amplitude of the in-phase phasor and the quadrature phasor is continuously varied.

15. A serial advanced technology attachments (SATA) storage drive, comprising:
a clock source;
a serializer/deserializer having a plurality of data channels; and
a spread spectrum clock generator in each of the plurality of data channels, each of the spread spectrum clock generators being connected to the clock source, each of the spread spectrum clock generators comprising:
a delay circuit having an input connected to the clock source, a first output and a second output, wherein the first and second outputs have a phase offset;
a first variable gain amplifier connected to the first output;
a second variable gain amplifier connected to the second output;
a summer connected to the first and second variable gain amplifiers;
a spectrum spreading input;
an integrator connected to the spectrum spreading input; and
a phase offset divider connected to the integrator, the phase offset divider having a first phase offset output and a second phase offset output, the first and second phase offset outputs having a common frequency and a different phase, the first phase offset output being connected to a gain control input on the first variable gain amplifier, the second phase offset output being connected to a gain control input on the second variable gain amplifier, wherein a data rate in each of the plurality of data channels in the SATA storage drive is independently and continuously modulated by the spread spectrum generators.

16. The serial advanced technology attachments (SATA) storage drive of claim 15, wherein the phase offset divider comprises a polyphase filter.

17. The serial advanced technology attachments (SATA) storage drive of claim 15, further comprising:
a frequency modulator having a frequency offset input, a first output connected to a gain input of the first variable gain amplifier and a second output connected to a gain input of the second variable gain amplifier.

18. The serial advanced technology attachments (SATA) storage drive of claim 17, wherein the frequency modulator comprises an integrator having an input and an output, the input being connected to the frequency offset input.

19. The serial advanced technology attachments (SATA) storage drive of claim 18, wherein the integrator comprises:
an accumulator having a first input, a second input and an output, the first input being connected to the frequency offset input and the output comprising the integrator output; and
a delay element having an input connected to the accumulator output and an output connected to the second input of the accumulator.

20. The serial advanced technology attachments (SATA) storage drive of claim 18, the frequency modulator further comprising a second quadrature delay circuit having an input, a first output and a second output, the input being connected to the integrator output.

21. The serial advanced technology attachments (SATA) storage drive of claim 20, wherein the second quadrature delay circuit comprises a lookup table.

22. The serial advanced technology attachments (SATA) storage drive of claim 20, the frequency modulator further comprising:
a first digital to analog converter having an input and an output, the input being connected to the first output of the second quadrature delay circuit; and
a second digital to analog converter having an input and an output, the input being connected to the second output of the second quadrature delay circuit.

23. The serial advanced technology attachments (SATA) storage drive of claim 22, the frequency modulator further comprising:
a first low pass filter having an input and an output, the input being connected to the output of the first digital to analog converter, the output being connected to the first output of the frequency modulator; and
a second low pass filter having an input and an output, the input being connected to the output of the second digital to analog converter, the output being connected to the second output of the frequency modulator.

24. The serial advanced technology attachments (SATA) storage drive of claim 15, wherein the drive comprises a storage device having a clock source connected to a plurality of serializer/deserializers, wherein the quadrature delay circuit, first and second amplitude modulators and summer are connected between the clock source and at least one of the plurality of serializer/deserializers to provide a plurality of different frequency offsets in the plurality of serializer/deserializers.

25. The serial advanced technology attachments (SATA) storage drive of claim 24, wherein the first and second amplitude modulators and the summer comprise a Gilbert cell mixer.

* * * * *